US010163924B2

(12) United States Patent
Ahn

(10) Patent No.: US 10,163,924 B2
(45) Date of Patent: Dec. 25, 2018

(54) MANUFACTURING METHOD OF THREE-DIMENSIONAL SEMICONDUCTOR MEMORY DEVICE

(71) Applicant: SK hynix Inc., Gyeonggi-do (KR)

(72) Inventor: Jung Ryul Ahn, Gyeonggi-do (KR)

(73) Assignee: SK Hynix Inc. Gyeonggi-do (KR)

( * ) Notice: Subject to any disclaimer, the term of this patent is extended or adjusted under 35 U.S.C. 154(b) by 118 days.

(21) Appl. No.: 15/147,196

(22) Filed: May 5, 2016

(65) Prior Publication Data

US 2017/0162594 A1 Jun. 8, 2017

(30) Foreign Application Priority Data

Dec. 8, 2015 (KR) ........................ 10-2015-0174249

(51) Int. Cl.
| | |
|---|---|
| *H01L 21/336* | (2006.01) |
| *H01L 27/11582* | (2017.01) |
| *H01L 21/31* | (2006.01) |
| *H01L 27/11556* | (2017.01) |
| H01L 27/11519 | (2017.01) |
| H01L 27/11565 | (2017.01) |

(52) U.S. Cl.
CPC ........ *H01L 27/11582* (2013.01); *H01L 21/31* (2013.01); *H01L 27/11556* (2013.01); *H01L 27/11519* (2013.01); *H01L 27/11565* (2013.01)

(58) Field of Classification Search
CPC ............... H01L 21/31; H01L 27/11519; H01L 27/11556; H01L 27/11565; H01L 27/11582
USPC ........................................................ 438/269
See application file for complete search history.

(56) References Cited

U.S. PATENT DOCUMENTS

| | | | | |
|---|---|---|---|---|
| 2003/0211683 A1* | 11/2003 | Kim | ....................... | H01L 21/763 438/221 |
| 2014/0042512 A1* | 2/2014 | Jeon | ..................... | H01L 27/1052 257/314 |
| 2014/0367762 A1* | 12/2014 | Tian | .................. | H01L 29/66825 257/321 |
| 2015/0102346 A1* | 4/2015 | Shin | ..................... | H01L 27/1157 257/66 |
| 2015/0287798 A1* | 10/2015 | Hsiao | ................ | H01L 29/42376 257/288 |
| 2015/0380418 A1* | 12/2015 | Zhang | ............... | H01L 27/11529 257/326 |

FOREIGN PATENT DOCUMENTS

KR 1020160109971 9/2016

* cited by examiner

*Primary Examiner* — Duy T Nguyen
(74) *Attorney, Agent, or Firm* — IP & T Group LLP

(57) ABSTRACT

A method of manufacturing a semiconductor device includes sequentially stacking a source sacrificial layer, an upper protective layer, and an etch stop layer, which are formed of different materials from each other, over a substrate, alternately stacking interlayer dielectric layers and gate sacrificial layers over the etch stop layer, forming a first slit which penetrates the interlayer dielectric layers and the gate sacrificial layers, wherein a bottom surface of the first slit is disposed in the etch stop layer, replacing the gate sacrificial layers with gate conductive patterns through the first slit, forming a second slit which extends from the first slit through the etch stop layer and the upper protective layer to the source sacrificial layer, and replacing the source sacrificial layer with a first source layer through the second slit.

20 Claims, 10 Drawing Sheets

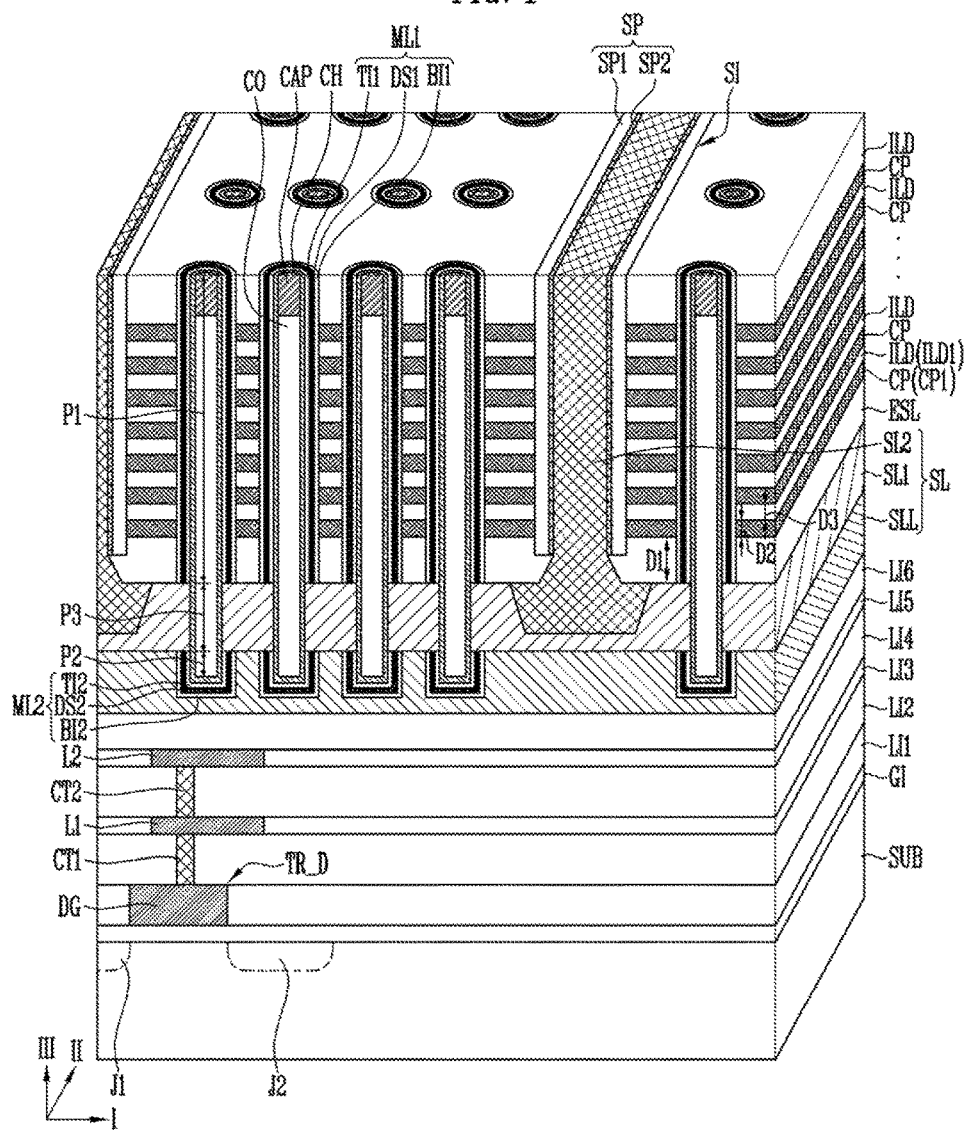

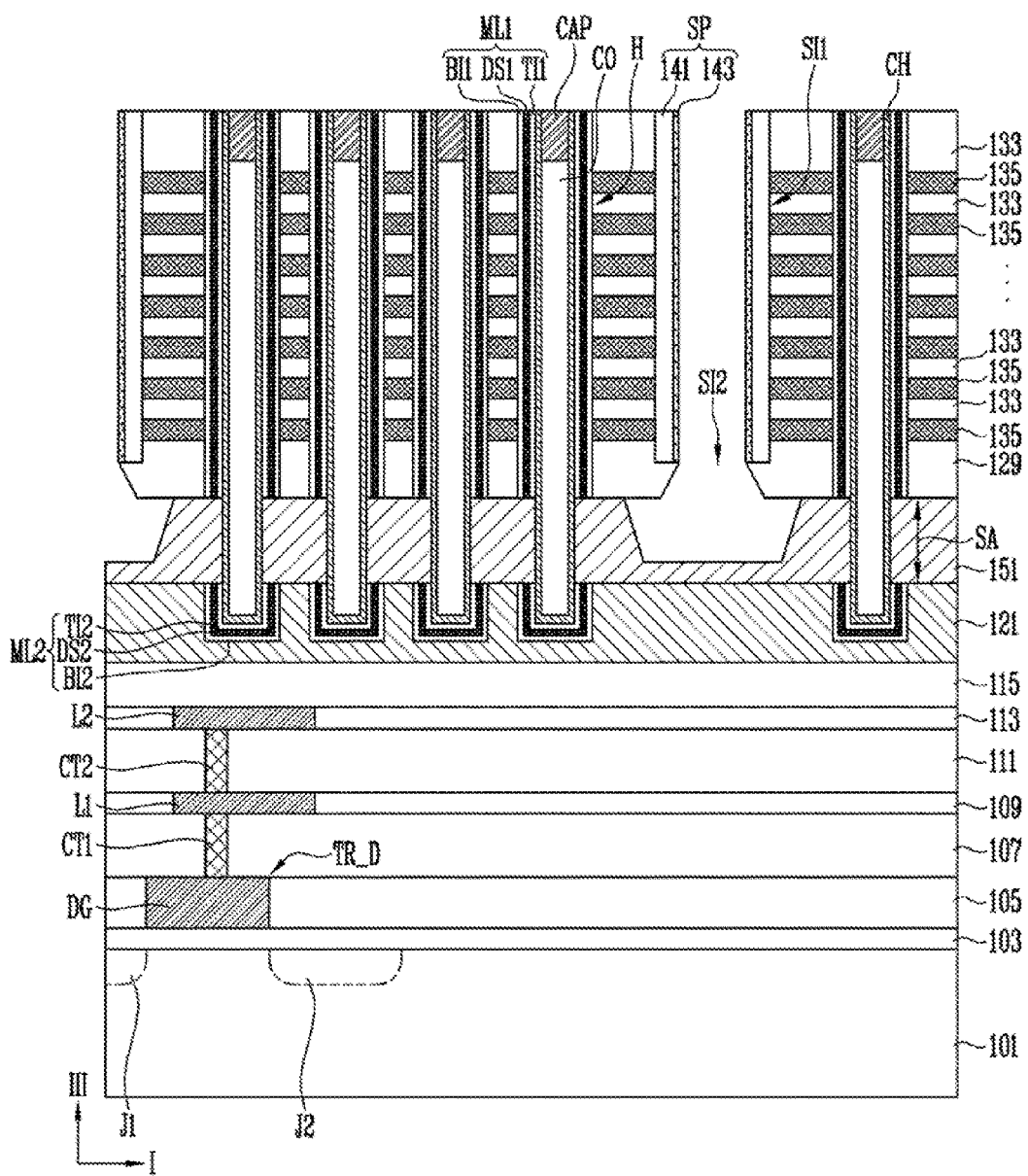

MANUFACTURING METHOD OF THREE-DIMENSIONAL SEMICONDUCTOR MEMORY DEVICE

CROSS-REFERENCE TO RELATED APPLICATION

The present application claims priority under 35 U.S.C. 119(a) to Korean patent application number 10-2015-0174249, filed on Dec. 8 2015, the entire disclosure of which is herein incorporated by reference in its entirety.

BACKGROUND

1. Field

An aspect of the present disclosure relates to a manufacturing method of a semiconductor device, and more particularly, to a manufacturing method of a three-dimensional semiconductor memory device.

2. Description of the Related Art

A semiconductor device may include a plurality of memory cells capable of storing data. A three-dimensional semiconductor memory device including three-dimensionally arranged memory cells has been proposed in order to achieve a high degree of integration of semiconductor devices.

The memory cells of the three-dimensional semiconductor memory device may be stacked over each other. The memory cells may be connected in series through a channel layer to form memory strings. The channel layer may be connected to a bit line and a source layer. The memory cells may be respectively connected to word lines surrounding the channel layer. The word lines are stacked along the channel layer while being spaced apart from each other.

There have been developed various techniques for decreasing the degree of difficulty of a manufacturing process of the three-dimensional semiconductor memory device of the above-described structure. When the degree of difficulty of the manufacturing process is decreased, there may be a need for improving the operational reliability of the three-dimensional memory device.

SUMMARY

According to an aspect of the present disclosure, there is provided a method of manufacturing a semiconductor device, the method including: sequentially stacking a source sacrificial layer, an upper protective layer and an etch stop layer, which are formed of different materials from each other, over a substrate; alternately stacking interlayer dielectric layers and gate sacrificial layers over the etch stop layer; forming a first slit which penetrates the interlayer dielectric layers and the gate sacrificial layers, wherein a bottom surface of the first slit is disposed in the etch stop layer; replacing the gate sacrificial layers with gate conductive patterns through the first slit; forming a second slit which extends from the first slit through the etch stop layer and the upper protective layer to the source sacrificial layer; and replacing the source sacrificial layer with a first source layer through the second slit.

BRIEF DESCRIPTION OF THE DRAWINGS

Example embodiments will now be described more fully hereinafter with reference to the accompanying drawings, however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements or one or more intervening elements may also be present. Like reference numerals refer to like elements throughout.

FIG. 1 is a perspective view illustrating a semiconductor device according to an embodiment of the present disclosure.

FIGS. 2A to 2H are sectional views illustrating a manufacturing method of a semiconductor device according to an embodiment of the present disclosure.

DETAILED DESCRIPTION

Figure 2A:
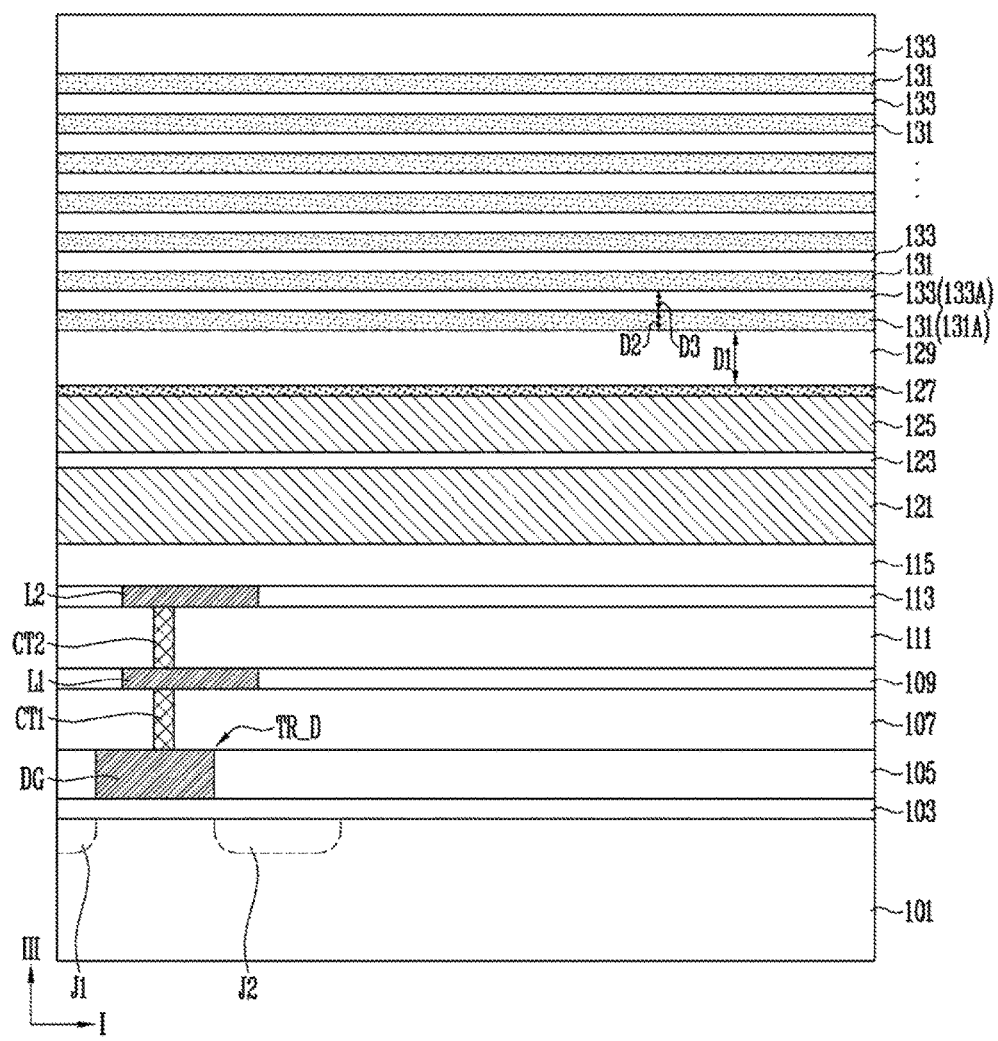

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and regions may be exaggerated for clarity. The drawings are not to scale. Like reference numerals refer to like elements throughout.

Embodiments provide a manufacturing method of a semiconductor device having improved operational reliability. FIG. 1 is a perspective view illustrating a semiconductor device according to an embodiment of the present disclosure. Referring to FIG. 1, the semiconductor device according to the embodiment of the present disclosure includes interlayer dielectric layers ILD and gate conductive patterns CP, which are alternately stacked, an etch stop layer ESL, channel layers CH, and a source structure SL.

Each of the interlayer dielectric layers ILD and the gate conductive patterns CP may be formed in a plate shape extending along a first direction I and a second direction II intersecting the first direction I, or may be formed in a line shape extending along the second direction II. The shape of the interlayer dielectric layers ILD and the gate conductive patterns CP may be defined by a slit SI penetrating the interlayer dielectric layers ILD and the gate conductive patterns CP. The slit SI may extend along the second direction II.

The gate conductive patterns CP may be used as gate electrodes of select transistors and memory cells. The interlayer dielectric layers ILD are used to insulate the gate conductive pattern CP from each other. The gate conductive patterns CP may include at least one of polysilicon, metal, or metal silicide. The interlayer dielectric layers ILD may include an oxide.

The etch stop layer ESL is disposed under the gate conductive patterns CP and the interlayer insulating layers ILD. The thickness D1 of the etch stop layer ESL may be formed thicker than the thickness D2 of a first gate conductive pattern CP1 which is located closest to the etch stop layer ESL among the gate conductive patterns CP. The thickness D1 of the etch stop layer ESL may be formed thicker than the thickness D3 of a first interlayer dielectric layer ILD1 which is located closest to the etch stop layer ESL among the interlayer dielectric layers ILD.

The etch stop layer ESL may be formed of an insulating material for insulating the source structure SL and the first gate conductive pattern CP1 from each other. For example, the etch stop layer ESL play be formed of the same material as the interlayer dielectric layers ILD. More specifically, the etch stop layer ESL may be formed of an oxide layer.

The thickness D1 of the etch stop layer ESL may be formed to allow the first gate conductive pattern CP1 and the source structure SL to be sufficiently spaced apart from each other so that the operational reliability of the semiconductor device improves when program, erase, and read operations of the semiconductor device are performed. The spacing distance between the first gate conductive pattern CP1 and the source structure SL may be variously changed depending on a design of the semiconductor device.

The slit SI may extend to the inside of the etch step layer ESL, but does not completely penetrate the etch stop layer ESL. A spacer SP may be further formed on a sidewall of the slit SI. The spacer SP may be formed into a double-layered structure of a first spacer SP1 and a second spacer SP2, which are formed of different materials from each other. The first spacer SP1 may contact sidewalls of the interlayer dielectric layers ILD and sidewalls of the gate conductive patterns CR The first spacer SP1 may be formed of an oxide layer. The second spacer SP2 may be formed on the first spacer SP1. The second spacer SP2 may be formed of a nitride layer.

Each of the channel layers CH may extend along a third direction III intersecting the first and second directions I and II by penetrating the interlayer dielectric layers ILD, the gate conductive patterns CP, and the etch stop layer ESL. More specifically, the third direction III may be a stacking direction of the interlayer dielectric layers ILD and the gate conductive patterns CP. Each of the channel layers CH may further extend down into the inside of the source structure SL disposed beneath the etch stop layer ESL.

The source structure SL may include a first source layer SL1 disposed beneath the etch stop layer ESL, a lower source layer SLL disposed beneath the first source layer SL1, and a second source layer SL2 filling the slit SI. The second source layer SL2 extends to the inside of the first source layer SL1 by penetrating the etch stop layer ESL. The first source SL1 and the lower source layer SLL may extend along the first and second directions I and II, and the second source layer SL2 may extend along the same direction as the extending direction of the slit SI.

The first source layer SL1 may be formed of a different conductive material from the gate conductive pattern CP. For example, the first source layer SL1 may be formed of a polysilicon layer, and the gate conductive patterns CP may be formed of a conductive material having a lower resistance than the polysilicon layer. The first source layer SL1 may be contacted with the etch stop layer ESL. According to an embodiment of the present disclosure, the first source layer SL1 directly contacts the etch stop layer ESL. This will be described later with reference to FIGS. 2A to 2H.

The first source layer SL1 may be formed of the same conductive material as the lower source layer SLL. The second source layer SL2 may be formed of a conductive material having a lower resistance of the first source layer SL1 and the lower source layer SLL. For example, the second source layer SL2 may be formed of tungsten. In this case, the second source layer SL2 may include a tungsten layer and a barrier metal layer. The barrier metal layer is formed along a sidewall and a bottom surface of the tungsten layer. The barrier metal layer may have a stacked structure which is formed of a titanium layer and a titanium nitride layer.

The first source layer SU may be penetrated by the channel layers CH. The channel layers CH may extend down to an upper portion of the lower source layer SLL.

Each of the channel layers CH may be formed in a tube shape with a hollow center and surround a core insulating layer CO. In this case, an upper surface of the core insulating layer CO may be formed at a lower level than an upper surface of the channel layers CH. A capping layer CAP may be further formed on the core insulating layer CO. The capping layer CAP may be surrounded by any one of the channel layers. The channel layers CH and the capping layer CAP may be formed of a semiconductor material. The capping layer CAP may include a dopant having a higher concentration than the channel layers CH.

Although not shown in this figure, the capping layer CAP and the core insulating layer CO may not be formed. In this case, each of the channel layers CH may be in a pillar shape with a filled center, rather than a tube with a hollow center. Each of the channel layers CH may be used as a channel of a memory string.

Each of the channel layer CH may be divided into first to third portions P1 to P3. The first portion P1 penetrates the gate conductive patterns CP, the interlayer dielectric layers ILD, and the etch stop layer ESL. The second portion P2 penetrates the lower source layer SLL. The third portion P3 is disposed between the first and second portions P1 and P2. The third portion P3 of each of the channel layers CH is contacted with a first source layer SL1. The first source layer SL1 may be grown from the third portion P3 of each of the channel layers CH and the lower source layer SLL.

The outer wall of the first portion P1 of each of the channel layers CH may be surrounded by a first multi-layered pattern ML1. The first multi-layered pattern ML1 may include a first tunnel insulating pattern TI1 surrounding the outer wall of the first portion P1, a first data storage pattern DS1 surrounding the first tunnel insulating pattern TI1, and a first blocking insulating pattern BI1 surrounding the first data storage pattern DS1.

The outer wall of the second portion P2 of each of the channel layers CH may be surrounded by a second multi-layered pattern ML2. The second multi-layered pattern ML2 may include a second tunnel insulating pattern TI2 surrounding the outer wall of the second portion P2, a second data storage pattern DS2 surrounding the second tunnel insulating pattern TI2, and a blocking insulating pattern BI2 surrounding the second data storage pattern DS2.

The first multi-layered pattern ML1 and the second multi-layered pattern ML2 may be separated by the first source layer SL1. The first tunnel insulating pattern TI1 and the second tunnel insulating pattern TI2 are portions of a tunnel insulating layer separated through the first source layer SL1. The first data storage pattern DS1 and the second data storage pattern DS2 are portions of a data storage layer separated through the first source layer SL1. The first blocking insulating pattern BI1 and the second blocking insulating pattern BI2 are portions of a blocking insulating layer separated through the first source layer SL1. The data storage layer may include silicon, nitride, phase change material, nano-dot etc. The blocking insulating layer may include an oxide layer capable of blocking electric charges.

According to the above-described embodiment of the present disclosure, a select transistor is formed at an intersection portion of each of the channel layers CH and a select line among the gate conductive patterns CP. A memory cell is formed at an intersection portion of each of the channel layers CH and a word line among the gate conductive patterns CP. The uppermost and lowermost conductive patterns among the gate conductive patterns CP may be used as upper and lower select lines, respectively. The patterns disposed between the uppermost and lowermost conductive patterns among the gate conductive patterns CP may be used as word lines.

According to the structure described above, an upper select transistor connected to an upper select line, a lower select transistor connected to a lower select line, and memory cells connected to word lines can be connected in series to each other by each of the channel layers CH. The memory string includes an upper select transistor, memory cells, and a lower select transistor, which are connected in series.

In the semiconductor device according to the embodiment of the present disclosure, a drive transistor TR_D constituting a circuit for driving the memory string of the semiconductor device may be disposed under the source structure SL. The drive transistor TR_D may include a gate electrode DG and junction areas J1 and J2. The gate electrode DG may be formed over a substrate SUB with a gate insulating layer GI interposed there between. The junction areas J1 and J2 may be doped areas and disposed in the substrate SUB at both sides of the gate electrode DG. Each of the junction areas J1 and J2 may be used as a source or drain of the drive transistor TR_D.

In order to achieve high integration of the semiconductor device by decreasing the area of the substrate SUB occupied in the semiconductor device, the drive transistor TR_D may overlap the source structure SL and be located under the source structure SL. The drive transistor TR_D may be electrically connected to another element through routing lines L1 and L2 and contact plugs CT1 and CT2, which are disposed inside multilayered lower insulating layers LI1 to LI6.

For example, the gate electrode DG of the drive transistor TR_D may be formed in a first lower insulating layer LI1. The gate electrode DG of the drive transistor TR_D may be covered with a second lower insulating layer LI2. The second lower insulating layer LI2 may be penetrated by a first contact plug CT1, which contacts the gate electrode DG and extends along the third direction III. A third lower insulating layer LI3 may be disposed on the second lower insulating layer LI2 including the first contact plug CT1. The third lower insulating layer LI3 may be penetrated by a first routing line L1, which contacts the first contact plug CT1. The third lower insulating layer LI3 including the first routing line L1 may be covered with a fourth lower insulating layer LI4. The fourth lower insulating layer LI4 may be penetrated by a second contact plug CT2, which contacts the first routing line L1, and extends along the third direction III. A fifth lower insulating layer LI5 may be disposed on the fourth lower insulating layer LI4 including the second contact plug CT2. The fifth lower insulating layer LI5 may be penetrated by a second routing line L2, which contacts the second contact plug CT2. A sixth lower insulating layer LI6 may be disposed on the fifth lower insulating layer LI5 including the second routing line L2.

Although not shown in this figure, the sixth lower insulating layer LI6 may be penetrated by a contact plug, etc., through which the second routing line L2 and a structure formed over the sixth lower insulating layer LI6 are connected to each other.

According to an embodiment of the invention, the height of the slit SI is controlled so that the slit SI may not completely pass through the etch stop layer ESL. Thus, the second multilayer pattern ML2 surrounding a lower portion of the channel layer CH may be prevented from being completely removed. Therefore, according to an embodiment of the invention, an empty space may be prevented from being formed between the channel layer CH and the first source layer SL1. As a result, the channel layer CH may be stably supported.

FIGS. 2A to 2H are sectional views illustrating a manufacturing method for a semiconductor device according to an embodiment of the present disclosure. Referring to FIG. 2A, a drive transistor TR_D constituting a peripheral circuit may be formed over a substrate 101. The drive transistor TR_D may be formed through the following processes.

First, a gate insulating layer 103 is formed on the substrate 101. A gate conductive layer is formed on the gate insulating layer and then patterned, there by forming a gate electrode DG. Subsequently, a dopant is implanted into the substrate 101 at both sides of the gate electrode DG, thereby forming junction areas J1 and J2. After that, a first lower insulating layer 105 is formed on the gate insulating layer 103 having the gate electrode DG formed thereon. A surface of the first lower insulating layer 105 may be planarized.

After the drive transistor TR_D is, formed, a second insulating layer 107 may be formed on the first lower insulating layer 105. Then, a first contact plug CT1 may be formed which penetrates the second lower insulating layer 107. The first contact plug CT1 may be connected to the gate electrode DG of the drive transistor TR_D.

Subsequently, a third lower insulating layer 109 penetrated by a first routing line L1 may be formed on the second lower insulating layer 107 including the first contact plug CT1. The first routing line L1 may be formed by forming a trench in the third lower insulating layer 109 and then filling a conductive material in the trench. Alternatively, the first routing line L1 may be formed by patterning a conductive material. The first routing line L1 may be connected to the first contact plug CT1.

A fourth lower insulating layer 111 may be formed on the third lower insulating layer 109 including the first routing line L1. Subsequently, a second contact plug CT2 may be formed which penetrates the fourth lower insulating layer 111. The second contact plug CT2 may be connected to the first routing line L1.

Subsequently, a fifth lower insulating layer 113 penetrated by a second routing line L2 may be formed on the fourth lower insulating layer 111 including the second contact plug CT2. The second routing line L2 may be formed by forming a trench in the fifth lower insulating layer 113 and then filling a conductive material in the trench. Alternatively, the second routing line L2 may be formed by patterning a conductive material. The second routing line L2 may be connected to the second contact plug CT2.

A sixth lower insulating layer 115 may be formed on the fifth lower insulating layer 113 including the second routing line L2. Although not shown in this figure, a third contact plug or third routing line connected to the second contact plug CT2 may be formed in the sixth lower insulating layer 115. The structure disposed under the sixth lower insulating layer 115 is not limited to what is described above, and may be variously modified.

After the sixth lower insulating layer 115 is formed, a source sacrificial layer 125, an upper protective layer 127, and an etch stop layer 129, which are formed of different materials from each other, are sequentially stacked over the sixth lower insulating layer 115. Before the source sacrificial layer 125 is formed a lower source layer 121 and a lower protective layer 123 may be sequentially stacked on the sixth lower insulating layer 115. In this case, the source sacrificial layer 125 may be formed on a stacked structure of the lower source layer 121 and the lower protective layer 123.

The lower source layer 121 may be formed of a conductive material. The lower source layer 121 may be formed of a conductive material and be used as a growth seed layer of a first source layer in a subsequent process. For example, the lower source layer 121 may be formed of polysilicon.

The lower protective layer 123 may be formed of a material having a different etching selection ratio from the source sacrificial layer 125. For example, the lower protective layer 123 may be formed of an oxide. The source sacrificial layer 125 may be formed of a material which will be selectively removed in a subsequent process. For example, the source sacrificial layer 125 may be formed of polysilicon.

The upper protective layer 127 may be formed of a material having a different etching selection ratio from the source sacrificial layer 125. The upper protective layer 127 may be formed of a different material from the lower protective layer 123. For example, the upper protective layer 127 may be formed of a nitride layer.

The etch stop layer 129 may be formed with a first thickness D1. The first thickness D1 may be sufficiently thick so that the etch stop layer 129 is not penetrated in a subsequent etching process for forming a first slit. More specifically, the first thickness D1 may be formed thicker than a second thickness D2 of a first gate sacrificial layer 131A, which is located closest to the etch stop layer 129 among the gate sacrificial layers 131 and also thicker than a third thickness D3 of a first interlayer dielectric layer 133A, which is located closest to the etch stop layer 129 among interlayer dielectric layers 133.

The etch stop layer 129 may be formed of an insulating material so as to insulate a first source layer 151 and gate conductive patterns 135, which will be formed in a subsequent process, from each other. See FIG. 2H. For example, the etch stop layer 129 may be formed of the same material as the interlayer dielectric layers 133. More specifically, the etch stop layer 129 may include an oxide.

The interlayer dielectric layers 133 and the gate sacrificial layers 131 are alternately stacked on the etch stop layer 129. Each of the interlayer dielectric layers 133 and the gate sacrificial layers 131 may be formed to various thicknesses according to a design of the semiconductor device.

The gate sacrificial layers 131 may be formed of a sacrificial insulating material having a different etching selection ratio from the interlayer dielectric layers 133. In an embodiment, the interlayer dielectric layers 133 may be formed of a silicon oxide layer, and the gate sacrificial layers 131 may be formed of a silicon nitride layer. When the interlayer dielectric layers 133 and the gate sacrificial layers 131 are formed of the family of insulating materials, it is possible to decrease the degree of difficulty of etching processes for forming channel holes or slits.

Figure 2B:
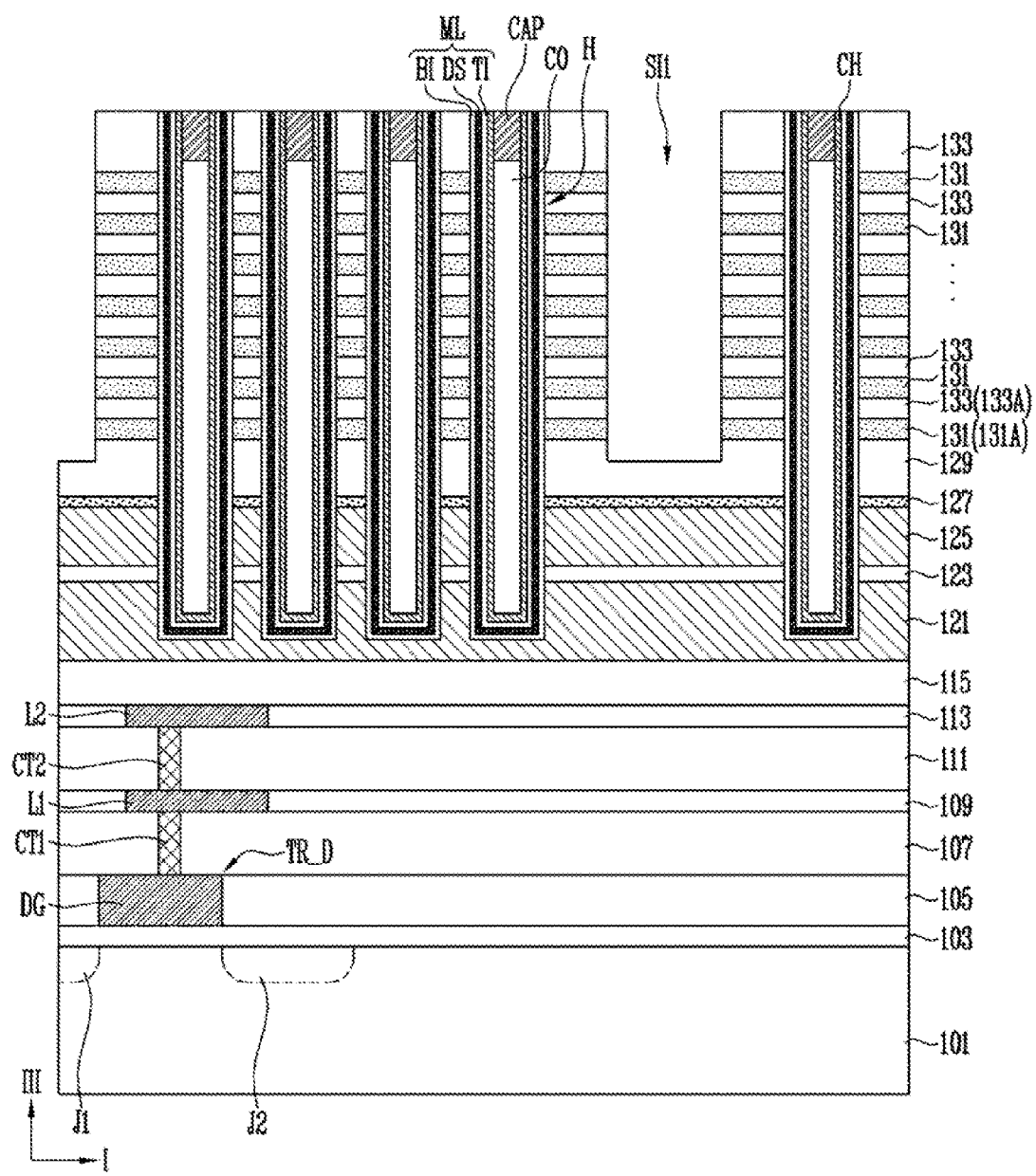

Referring to FIG. 2B, the gate sacrificial layers 131, the interlayer dielectric layers 133, the etch stop layer 129, the upper protective layer 127, and the source sacrificial layer 125 are etched, thereby forming channel holes H penetrating them. The channel holes H may extend down to the inside of the lower source layer 121 by penetrating the lower protective layer 123.

Subsequently, a channel layer CH surrounded by a multi-layered layer ML is formed inside each of the channel holes H. The multi-layered layer ML may be formed by sequentially stacking a blocking insulating layer BI, a data storage layer DS, and a tunnel insulating layer TI. The blocking insulating layer BI, the data storage layer DS, and the tunnel insulating layer TI may be formed on the surface of each of the channel holes H. The channel layer CH may be formed on the tunnel insulating layer TI. The channel layer CH may be formed to completely fill in the inside of each of the channel holes H, or may be formed to open a central area of each of the channel holes H. When the central area of each of the channel holes H is opened by the channel layer CH, the central area of each of the channel holes H may be filled with a core insulating layer CO. The core insulating layer CO may extend up to a level lower than a top surface of each of the channel holes H. In this case, a capping layer CAP may be further formed on the core insulating layer CO to fill in an upper end of each of the channel holes H.

Subsequently, a first slit SI1 penetrating the gate sacrificial layers 131 and the interlayer dielectric layers 133 may be formed by etching them. The etching process of forming the first slit SI1 is controlled such that the first slit SI1 does not completely penetrate the etch stop layer 129. Although the etch stop layer 129 is formed of the same material as the interlayer dielectric layers 133 the thickness of the etch stop layer 129 is thicker. Therefore, the first slit SI1 may penetrate a portion of the etch stop layer 129, but does not completely penetrate the etch stop layer 129. As the etching depth of the first slit SI1 is controlled as described above, the bottom surface of the first slit SI1 may be disposed in the etch stop layer 129. Accordingly, in an embodiment of the present disclosure, it is possible to prevent a phenomenon that the upper protective layer 127 is exposed by the first slit SI1.

Figure 2C:
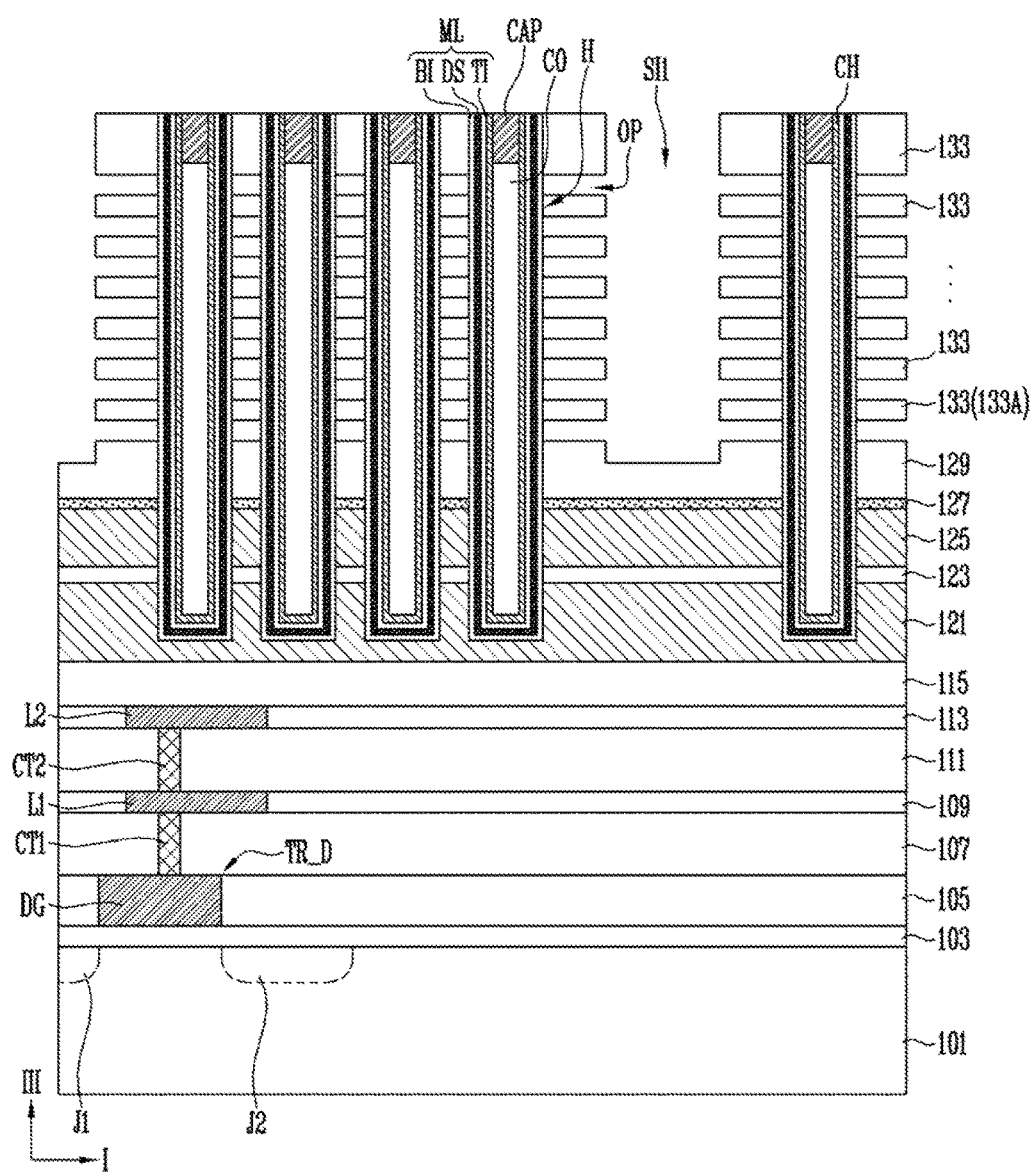

Referring to FIG. 2C, the gate sacrificial layers 131 exposed through the first slit SI1 are removed, thereby forming opening areas OP between the interlayer dielectric layers 133 and between the etch stop layer 129 and the first interlayer dielectric layer 133A. In this state, the channel layers CH are supported by the source sacrificial layer 125 and the lower source layer 121, and thus the structure of the channel layers CH can be stably maintained.

Figure 2D:
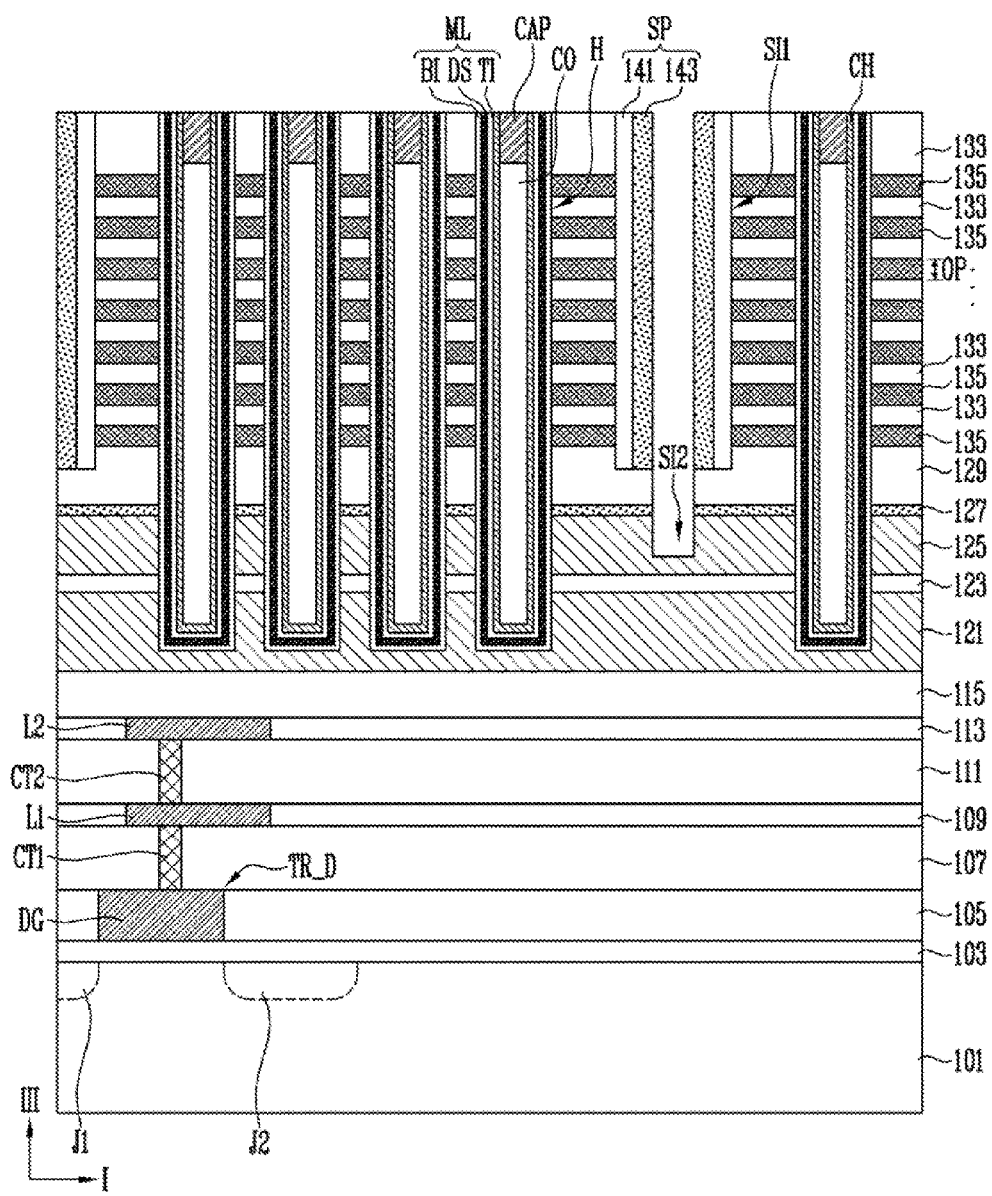

Referring to FIG. 2D, the opening areas OP may be filled with gate conductive patterns 135 through the first slit SI1. The gate conductive patterns 135 may be formed of various conductive materials. For example, the gate conductive patterns 135 may be formed of tungsten with low resistance. Although not shown in this figure, before the gate conductive patterns 135 are formed, at least one of a barrier layer and a blocking insulating layer may be further formed along the surface of each of the opening areas OP. Conductive materials remaining inside the first slit SI1 in the process of forming the gate conductive patterns 135 may be removed through an etching process.

According to the embodiment of the present disclosure, in a state in which the etch stop layer 129 remains between the upper protective layer 127 and the first slit SI1, the gate sacrificial layers 131 may be replaced with the gate conductive patterns 135 through the first slit SI1. As a result, in an embodiment of the present disclosure, the etch stop layer 129 can protect the upper protective layer 127 from influence of processes of replacing the gate sacrificial layers 131 with the gate conductive patterns 135. That is, the upper protective layer 127 is protected by the etch stop layer 129 and is not replaced with the gate conductive patterns 135. Thus, in an embodiment of the present disclosure, it is possible to reduce a malfunction of the semiconductor device which may be caused when the upper protective layer 127 is replaced with the same conductive material as the gate conductive patterns 135.

After the gate conductive patterns 135 are formed, a spacer SP is formed on inner sidewalls of the first slit SI1. The spacer SP may be formed of a double-layered structure of an oxide layer 141 and a nitride layer 143.

After the spacer SP is formed, the etch stop layer 129 and the upper protective layer 127, which are exposed through the first slit SI1, are etched, thereby forming a second slit SI2 penetrating them. The second slit SI2 may further penetrate a portion of the source sacrificial layer 125. The spacer SP may serve as an etching barrier while the second slit SI2 is being formed.

Figure 2E:
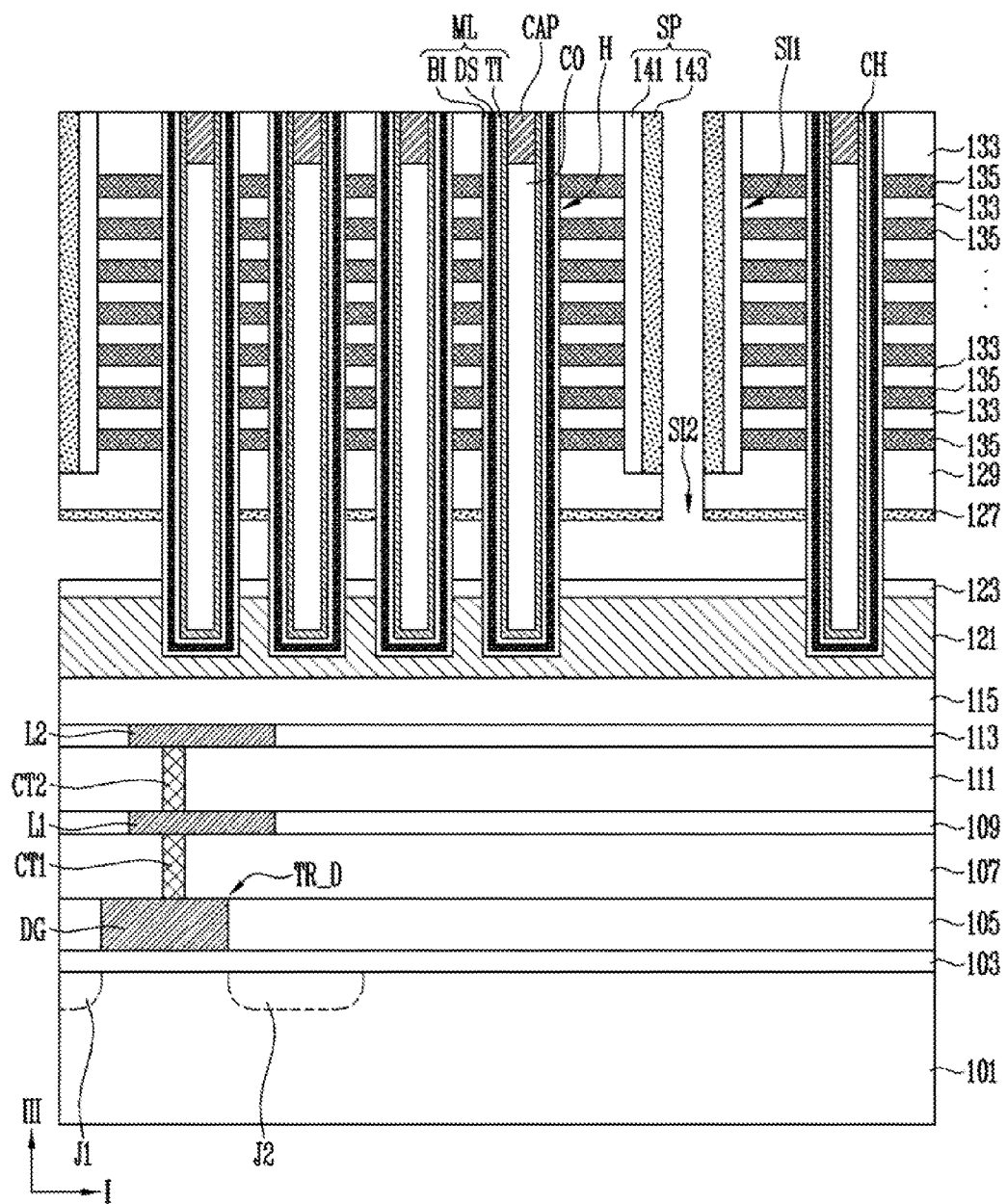

Referring to FIG. 2E, a portion of the multi-layered layer ML is exposed by selectively removing the source sacrificial layer 125 through the second slit SI2. In the process of removing the source sacrificial layer 125, the upper and lower protective layers 127 and 123 having a different etching selection ratio from the source sacrificial layer 125 are not removed but remain, thereby protecting the etch stop layer 129 and the lower source layer 121. Accordingly, the thicknesses of the etch stop layer 129 and the lower source layer 121 can be maintained without a significant loss.

Figure 2F:
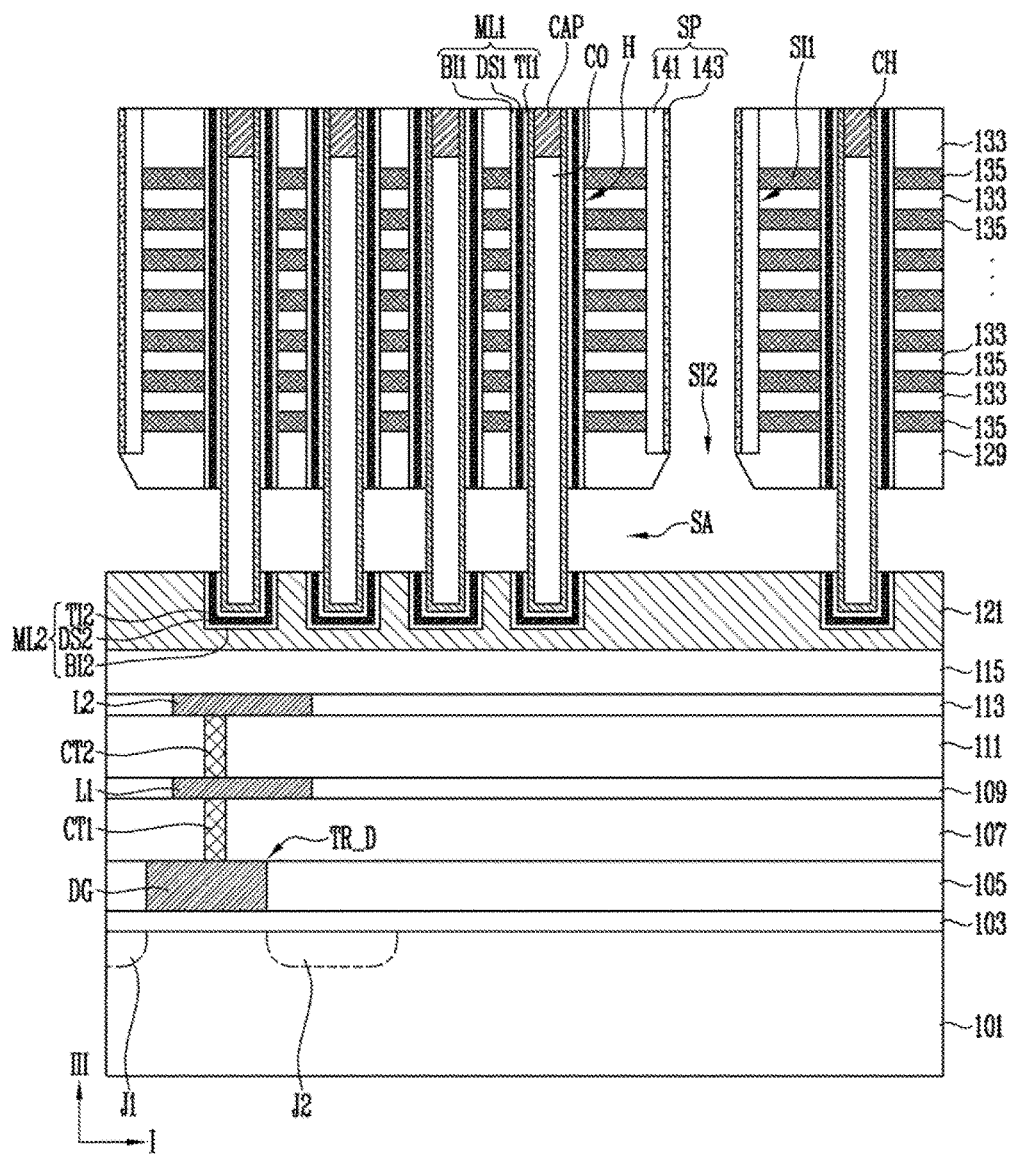

Referring to FIG. 2F, a source area SA between the lower source layer 121 and the etch stop layer 129 is opened by removing the exposed area of the multi-layered layer ML. In the process of the removing the exposed area of the multi-layered layer ML, the upper and lower protective layers 127 and 123 may be removed, The multi-layered layer ML may be separated into a first multi-layered pattern ML1 and a second multi-layered pattern ML2 through the etching process for forming the source area SA. More specifically, the blocking insulating layer BI may be divided into first and second blocking, insulating layers BI1 and BI2 by the source area SA. The data storage layer DS may be divided into first and second data storage layers DS1 and DS2. The tunnel insulating layer TI may be divided into first and second tunnel insulating layers TI1 and TI2 by the source area SA. A portion of each of the channel layers CH may be exposed through the source area SA.

Referring to FIG. 2G, a first source layer 151 may be grown from the lower source layer 121 and the channel layers CH which are exposed through the source area SA. Alternatively a first source layer 151 contacted with the lower source layer 121 and the channel layers CH may be formed by filling a conductive material in the source area SA. The first source layer 151 may be formed of polysilicon.

When the first source layer 151 is formed using a growth method using the lower source layer 121 and the channel layers CH as seed layers, a groove portion may be formed in a surface of the first source layer 151 and under the first slit SI1.

According to an embodiment of the present disclosure, the bottom surface of the first slit SI1 is located inside of the etch stop layer 129 since the etch stop layer 129 is sufficiently thick. Thus, it is possible to prevent a phenomenon that the upper protective layer 127 beneath the etch stop layer 129 is replaced with a conductive material for gate conductive patterns. Accordingly, the first source layer 151 formed as a single layer can be disposed between the etch stop layer 129 and the lower source layer 121. Further, the first source layer 151 can be disposed to contact the stop etch layer 129.

Figure 2H:
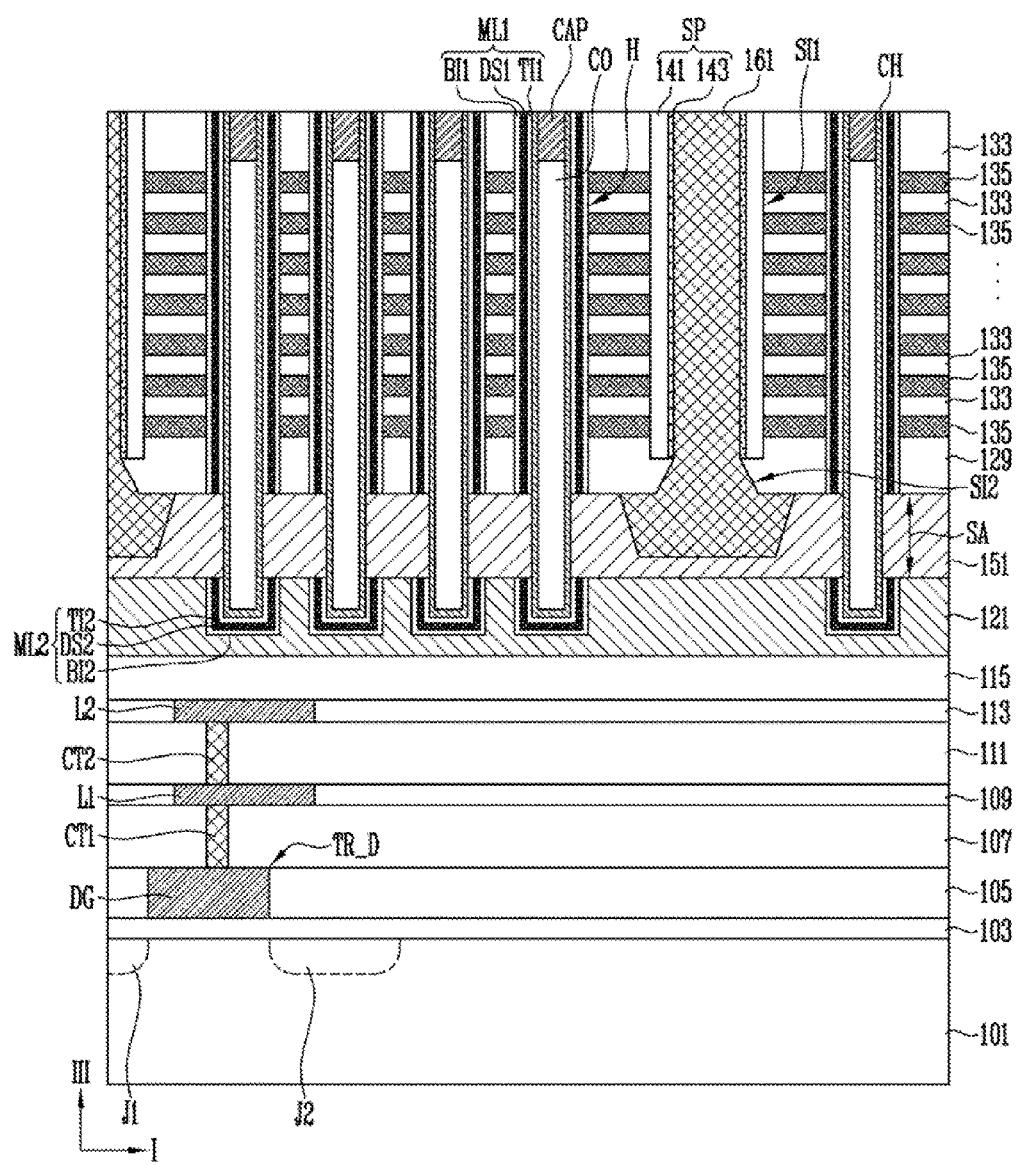

Referring to FIG. 2H, a second source layer 161 may be completely filled in the first slit SI1 and the second slit SI2. The second source layer 161 may be completely filled in the groove portion formed in the surface of the first source layer 151. The second source layer 161 may be formed of a conductive material having a lower resistance than the first source layer 151. For example, the second source layer 161 may include tungsten. A barrier metal layer formed of a stacked structure of a titanium layer and a titanium nitride layer may be further formed before the second source layer 161 formed of tungsten is formed.

Figure 3:
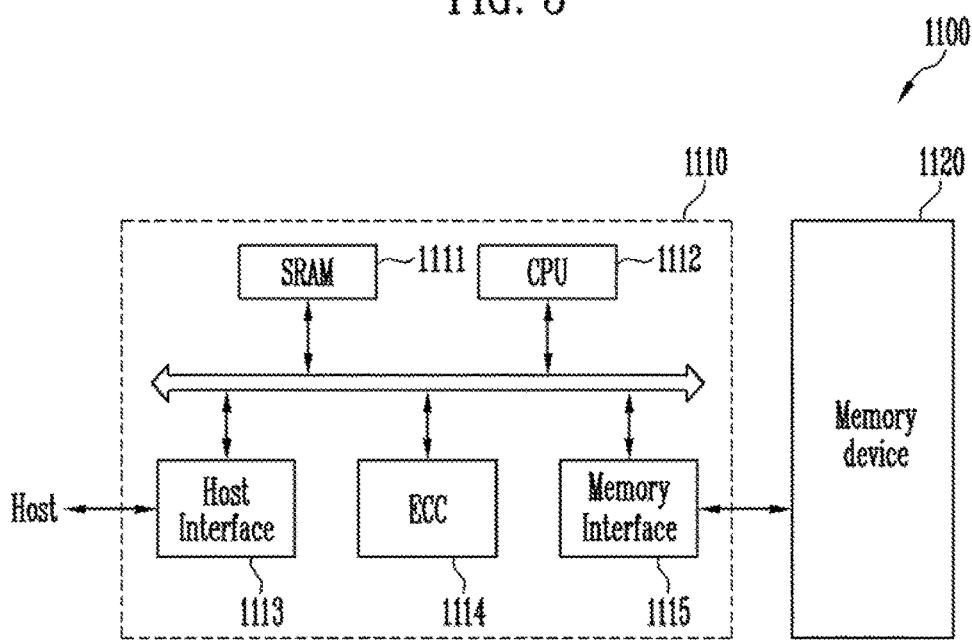
FIG. 3 is a block diagram illustrating a configuration of a memory system according to an embodiment of the present disclosure.

FIG. 3 is a block diagram illustrating a configuration of a memory system according to an embodiment of the present disclosure. Referring to FIG. 3, the memory system 1100 according to the embodiment of the present disclosure includes a memory device 1120 and a memory controller 1110.

The memory device 1120 may include the structure described in FIGS. 1 to 2H. Also, the memory device 1120 may be a multi-chip package formed of a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error included in data read from the memory device 1120, and the memory interface 1115 interfaces with the memory device 1120. In addition, the memory controller 1110 may further include art ROM for storing code data for interfacing with the host and the like.

The memory system 1100 configured as described above may be a memory card or a solid state disk (SSD), in which the memory device 1120 is combined with the controller 1110. For example, when the memory system 1100 is an SSD the memory controller 1100 may communicate with the outside for example with the host through various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 4:
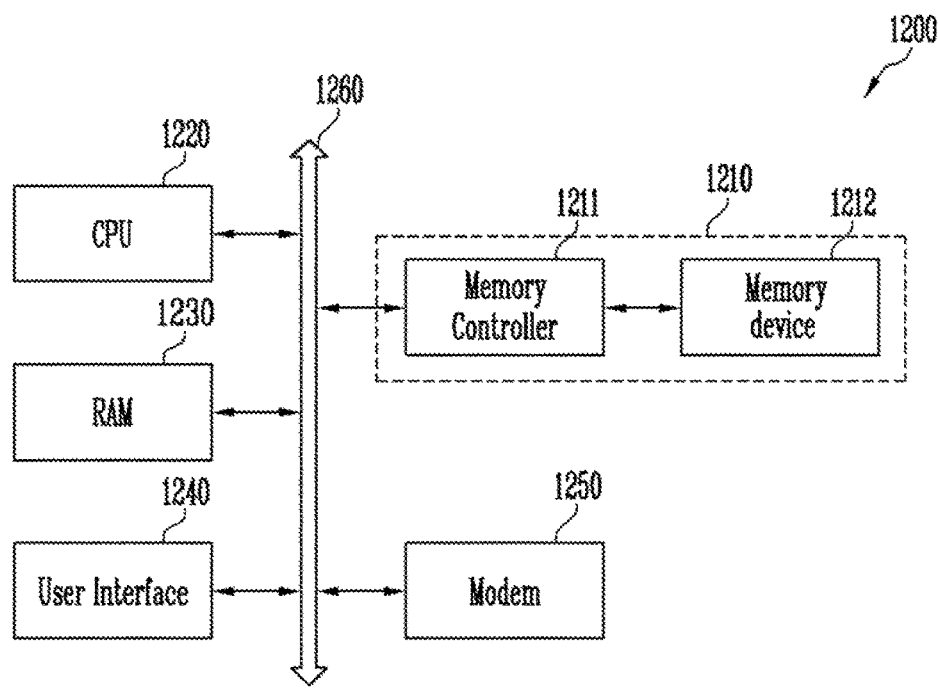
FIG. 4 is a block diagram illustrating a configuration of a computing system according to an embodiment of the present disclosure.

FIG. 4 is a block diagram illustrating a configuration of a computing system according to an embodiment of the present disclosure. Referring to FIG. 4, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included. Additionally, an application chip set, a camera image processor (CIS), a mobile D-RAM, and the like may be further included.

The memory system 1210, as described with reference to FIG. 3, may be configured with a memory device 1212 and a memory controller 1211.

According to the present disclosure, the interlayer dielectric layers and the gate sacrificial layers are alternately stacked on the source sacrificial layer. The gate sacrificial layers are replaced with the gate conductive patterns. The bottom of the first slit penetrates the interlayer dielectric layers and the gate sacrificial layers and extends inside the stop etch layer. However, the bottom of the first slit does not completely penetrate the stop etch layer. Accordingly, the upper protective layer, which is disposed beneath the etch stop layer, is not exposed by the first slit. Thus, the upper protective layer is not replaced with the gate conductive patterns in the process of replacing the gate sacrificial layers with the gate conductive patterns. As a result, it is possible to prevent a malfunction of the semiconductor device due to an unwanted conductive material, thereby improving the operational reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
   sequentially stacking a source sacrificial layer, an upper protective layer, and an etch stop layer, which are formed of different materials from each other, over a substrate;
   alternately stacking interlayer dielectric layers and gate sacrificial layers over the etch stop layer;
   forming a first slit which penetrates the interlayer dielectric layers and the gate sacrificial layers, wherein a bottom surface of the first slit is disposed in the etch stop layer;
   replacing the gate sacrificial layers with gate conductive patterns through the first slit;
   forming a second slit which extends from the first slit through the etch stop layer and the upper protective layer to the source sacrificial layer;
   replacing the source sacrificial layer with a first source layer through the second slit,
   wherein the etch stop layer is formed thicker than a first interlayer dielectric layer, the first interlayer dielectric layer located closest to the etch stop layer among the interlayer dielectric layers;
   before forming the source sacrificial layer, the upper protective layer, and the etch stop layer, forming a stacked structure over the substrate, the stacked structure including a lower source layer and a lower protective layer disposed on the lower source layer; and
   before the forming of the first slit, forming a channel layer penetrating the interlayer dielectric layers, the gate sacrificial layers, the etch stop layer the upper protective layer, the source sacrificial layer, and the lower protective layer.

2. The method of claim 1,
   wherein the gate sacrificial layers includes a first gate sacrificial layer,
   wherein the first gate sacrificial layer is located closest to the etch stop layer among the gate sacrificial layers, and
   wherein the etch stop layer is formed thicker than the first gate sacrificial layer.

3. The method of claim 1,
   wherein the source sacrificial layer includes polysilicon.

4. The method of claim 1,
   wherein the upper protective layer includes nitride.

5. The method of claim 1,
   wherein the etch stop layer includes oxide.

6. The method of claim 1,
   wherein the etch stop layer remains between the first slit and the upper protective layer while the first slit is formed.

7. The method of claim 1, further comprising:
   before the forming of the second slit, forming a spacer over a sidewall of the first slit.

8. The method of claim 7,
   wherein the spacer includes a double-layered structure of an oxide layer and a nitride layer.

9. The method of claim 1, further comprising:
   after the replacing of the source sacrificial layer with the first source layer, filling a second source layer in the first and the second slits.

10. The method of claim 9,
    wherein the second source layer includes a conductive material and has a lower resistance than the first, source layer.

11. The method of claim 1,
    wherein the etch stop layer includes an insulating material.

12. The method of claim 1, further comprising:
    before forming the source sacrificial layer, the upper protective layer, and the etch stop layer,
    forming a drive transistor over the substrate;
    forming a lower insulating layer over the drive transistor;
    forming a contact plug in the lower insulating layer, wherein the contact plug is connected to the drive transistor; and
    forming a routing line in the lower insulating layer, wherein the routing line is connected to the contact plug.

13. A method of manufacturing a semiconductor device, the method comprising:
    forming a stacked structure over a substrate, the stacked structure including a lower source layer and a lower protective layer disposed on the lower source layer;
    sequentially stacking a source sacrificial layer, an upper protective layer, and an etch stop layer, which are formed of different materials front each other, over the stacked structure;
    alternately stacking interlayer dielectric layers and gate sacrificial layers over the etch stop layer;
    forming a channel layer penetrating the interlayer dielectric layers, the gate sacrificial layers, the etch stop layer, the upper protective layer, the source sacrificial layer, and the lower protective layer;
    forming a first slit which penetrates the interlayer dielectric layers and the gate sacrificial layers, wherein a bottom surface of the first slit is disposed in the etch stop layer;
    replacing the gate sacrificial layers with gate conductive patterns through the first slit;

forming a second slit which extends from the first slit through the etch stop layer and the upper protective layer to the source sacrificial layer; and replacing the source sacrificial layer with a first source layer through the second slit.

14. The method of claim 13, wherein the channel layer is surrounded by a multi-layered layer, the multi-layered layer extending along an interface between the channel layer and a plurality of layers including the interlayer dielectric layers, the gate sacrificial layers, the etch stop layer, the upper protective layer, the source sacrificial layer and the lower protective layer, and wherein the multi-layered layer includes a tunnel insulating layer, a data storage layer, a blocking insulating layer, or a combination thereof.

15. The method of claim 14, wherein the replacing of the source sacrificial layer with the first source layer includes:

removing the source sacrificial layer through the second slit to expose a portion of the multi-layered layer;

removing the portion of the multi-layered layer to form a source area, wherein the source area divides the multi-layered layer into first and second multi-layered patterns and expose a portion of the channel layer, wherein the source area further exposes the lower protective layer;

removing the lower protective layer to expose the lower source layer; and growing the first source layer from the portion of the channel layer and the lower source layer, which are exposed through the source area.

16. The method of claim 15, wherein, during the removing of the source sacrificial layer, the lower source layer is protected by the lower protective layer and the etch stop layer is protected by the upper protective layer.

17. The method of claim 15, wherein the upper and the lower protective layers are removed while the portion of the multi-layered layer is removed.

18. The method of claim 13, wherein the upper and the lower protective layers are different materials from each other.

19. The method of claim 18, wherein the upper protective layer includes nitride, and wherein the lower protective layer includes oxide.

20. A method of manufacturing a semiconductor device, the method comprising:

forming a lower source layer over a substrate;

sequentially stacking a source sacrificial layer, an upper protective layer, and an etch stop layer, which are formed of different materials from each other, over the lower source layer;

alternately stacking interlayer dielectric layers and gate sacrificial layers over the etch stop layer;

forming a channel layer penetrating the interlayer dielectric layers, the gate sacrificial layers, the etch stop layer, the upper protective layer and the source sacrificial layer, and extending into the lower source layer;

forming a first slit penetrating the interlayer dielectric layers and the gate sacrificial layers, wherein a bottom surface of the first slit is disposed in the etch stop layer;

replacing the gate sacrificial layers with gate conductive patterns through the first slit;

forming a second slit which extends from the first slit through the etch stop layer and the upper protective layer to the source sacrificial layer;

removing the source sacrificial layer and the upper protective layer through the second slit to expose the lower source layer, the etch stop layer, and a portion of the channel layer; and forming a first source layer contacted with the portion of the channel layer between the lower source layer and the etch stop layer.

* * * * *